(12) United States Patent
Pai et al.

(10) Patent No.: US 12,469,770 B2
(45) Date of Patent: Nov. 11, 2025

(54) POWER SEMICONDUCTOR MODULE WITH RIVET OR PRESS FIT PIN AND METHOD FOR FABRICATING THE SAME

(71) Applicant: Infineon Technologies AG, Neubiberg (DE)

(72) Inventors: Ajay Poonjal Pai, Unterhaching (DE); Tao Hong, Soest (DE); Adrian Lis, Regensburg (DE); Oliver Markus Kreiter, Warstein (DE); Matthias Rose, Kirchseeon (DE)

(73) Assignee: Infineon Technologies AG, Neubiberg (DE)

( * ) Notice: Subject to any disclaimer, the term of this patent is extended or adjusted under 35 U.S.C. 154(b) by 600 days.

(21) Appl. No.: 17/875,929

(22) Filed: Jul. 28, 2022

(65) Prior Publication Data

US 2023/0054812 A1 Feb. 23, 2023

(30) Foreign Application Priority Data

Aug. 23, 2021 (DE) .......................... 102021121797.0

(51) Int. Cl.
*H01L 23/49* (2006.01)
*H01L 21/48* (2006.01)
(Continued)

(52) U.S. Cl.
CPC .......... *H01L 23/49* (2013.01); *H01L 21/4853* (2013.01); *H01L 21/56* (2013.01);
(Continued)

(58) Field of Classification Search
CPC ..... H01L 23/49; H01L 21/4853; H01L 21/56; H01L 23/3121; H01L 24/32;
(Continued)

(56) References Cited

U.S. PATENT DOCUMENTS

| 2007/0181997 A1* | 8/2007 | Ahr ......................... H01L 24/97 257/E23.092 |
| 2007/0215999 A1* | 9/2007 | Kashimoto ........... H01L 21/565 257/E21.504 |

(Continued)

FOREIGN PATENT DOCUMENTS

| DE | 102012208146 A1 | 12/2012 |
| DE | 102009042399 B4 | 8/2015 |
| EP | 3214647 A1 | 9/2017 |

*Primary Examiner* — Galina G Yushina
(74) *Attorney, Agent, or Firm* — Murphy, Bilak & Homiller, PLLC

(57) ABSTRACT

A power semiconductor module includes: first and second substrates; at least one power semiconductor die arranged between and thermally coupled to a first side of each substrate, and electrically coupled to the first side of the first substrate; at least one rivet having a first end arranged on and electrically coupled to the first side of the first substrate; and an encapsulant encapsulating the at least one power semiconductor die, the at least one rivet and the substrates. At least parts of a second side of the substrates are exposed from the encapsulant. A second end of the at least one rivet is exposed at the encapsulant and configured to accept a press fit pin such that the at least one power semiconductor die can be electrically contacted from the outside.

9 Claims, 4 Drawing Sheets

(51) Int. Cl.
  *H01L 21/56* (2006.01)
  *H01L 23/00* (2006.01)
  *H01L 23/31* (2006.01)
  *H01R 12/58* (2011.01)
(52) U.S. Cl.
  CPC ....... *H01L 23/3121* (2013.01); *H01R 12/585* (2013.01); *H01L 24/32* (2013.01); *H01L 2224/32225* (2013.01)
(58) Field of Classification Search
  CPC ..... H01L 2224/32225; H01L 23/49811; H01L 23/49833; H01L 23/36; H01L 23/3107; H01R 12/585
  See application file for complete search history.

(56) References Cited

U.S. PATENT DOCUMENTS

| | | | |
|---|---|---|---|
| 2010/0127389 A1* | 5/2010 | Obiraki | H01L 23/49811 |
| | | | 257/E23.08 |
| 2012/0098138 A1* | 4/2012 | Oka | H01L 21/56 |
| | | | 257/773 |
| 2015/0380274 A1* | 12/2015 | Yoshimatsu | H01L 21/56 |
| | | | 438/126 |
| 2020/0035580 A1* | 1/2020 | Hoegerl | H01L 23/433 |
| 2020/0203253 A1* | 6/2020 | Sakakibara | H01L 21/4882 |
| 2020/0303215 A1* | 9/2020 | Ichikawa | H01L 23/48 |

\* cited by examiner

POWER SEMICONDUCTOR MODULE WITH RIVET OR PRESS FIT PIN AND METHOD FOR FABRICATING THE SAME

TECHNICAL FIELD

This disclosure relates in general to power semiconductor modules, in particular to a power semiconductor module comprising a rivet or a press fit pin, as well as to methods for fabricating such power semiconductor modules.

BACKGROUND

A power semiconductor module comprises external contacts (e.g. in the form of pins or pads) like control contacts, sensing contacts and power contacts configured to couple the power semiconductor module to an external appliance. Coupling a power semiconductor module to an external appliance may comprise soldering, sintering, or gluing the pins or pads to an application board. However, these types of coupling processes may be time consuming and the quality of the resulting joint may vary. In order to simplify the coupling process, to speed up the coupling process, and to reduce the overall fabrication costs, it may be desirable to provide an alternative. Improved power semiconductor modules as well as improved methods for fabricating power semiconductor modules can help solving these and other problems.

SUMMARY

Various aspects pertain to a power semiconductor module, comprising: a first substrate and a second substrate, at least one power semiconductor die arranged between a first side of the first substrate and a first side of the second substrate, the at least one power semiconductor die being electrically and thermally coupled to at least the first side of the first substrate, at least one rivet, wherein a first end of the rivet is arranged on and electrically coupled to the first side of the first substrate, and an encapsulant encapsulating the at least one power semiconductor die, the at least one rivet and the first and second substrates, wherein at least parts of a second side of the first substrate opposing the first side of the first substrate and at least parts of a second side of the second substrate opposing the first side of the second substrate are exposed from the encapsulant, and wherein a second end of the at least one rivet is exposed at the encapsulant and configured to accept a press fit pin such that the at least one power semiconductor die can be electrically contacted from the outside.

Various aspects pertain to a power semiconductor module, comprising: a first substrate and a second substrate, at least one power semiconductor die arranged between and thermally coupled to a first side of the first substrate and a first side of the second substrate, the at least one power semiconductor die being electrically coupled to the first side of the first substrate, at least one press fit pin arranged on and electrically coupled to the first side of the first substrate, and an encapsulant encapsulating the at least one power semiconductor die, the at least one press fit pin and the first and second substrates, wherein at least parts of a second side of the first substrate opposing the first side of the first substrate and at least parts of a second side of the second substrate opposing the first side of the second substrate are exposed from the encapsulant, and wherein an external part of the at least one press fit pin is exposed from the encapsulant to form an external contact of the power semiconductor module.

Various aspects pertain to a method for fabricating a power semiconductor module, the method comprising: providing a first substrate and a second substrate, arranging at least one power semiconductor die between a first side of the first substrate and a first side of the second substrate and thermally coupling the at least one power semiconductor die to the first and second substrates, electrically coupling the at least one power semiconductor die to the first substrate, arranging at least one rivet or at least one press fit pin on the first side of the first substrate and electrically coupling the at least one rivet or at least one press fit pin to the first side of the first substrate, and encapsulating the at least one power semiconductor die, the at least one rivet or the at least one press fit pin and the first and second substrates with an encapsulant such that at least parts of a second side of the first substrate opposing the first side of the first substrate and at least parts of a second side of the second substrate opposing the first side of the second substrate are exposed from the encapsulant, and such that the at least one rivet or the at least one press fit pin is exposed at the encapsulant to form an external contact of the power semiconductor module.

BRIEF DESCRIPTION OF THE DRAWINGS

The accompanying drawings illustrate examples of the present disclosure. Other examples and many of the intended advantages of the disclosure will be readily appreciated in view of the following detailed description. The elements of the drawings are not necessarily to scale relative to each other. Identical reference numerals designate corresponding similar parts.

DETAILED DESCRIPTION

While a particular feature or aspect of an example may be disclosed with respect to only one of several implementations, such feature or aspect may be combined with one or more other features or aspects of the other implementations as may be desired and advantageous for any given or particular application, unless specifically noted otherwise or unless technically restricted. Furthermore, to the extent that the terms "include", "have", "with" or other variants thereof are used in either the detailed description or the claims, such terms are intended to be inclusive in a manner similar to the term "comprise". The terms "coupled" and "connected", along with derivatives thereof may be used. It should be understood that these terms may be used to indicate that two elements cooperate or interact with each other regardless whether they are in direct physical or electrical contact, or they are not in direct contact with each other; intervening elements or layers may be provided between the "bonded", "attached", or "connected" elements. However, it is also possible that the "bonded", "attached", or "connected" elements are in direct contact with each other. Also, the term "exemplary" is merely meant as an example, rather than the best or optimal.

The examples of a power semiconductor module may use various types of semiconductor dies or circuits incorporated in the semiconductor dies, among them AC/DC or DC/DC converter circuits, power MOS transistors, power Schottky diodes, JFETs (Junction Gate Field Effect Transistors), power bipolar transistors, logic integrated circuits, analogue integrated circuits, mixed signal integrated circuits, sensor circuits, power integrated circuits, etc. The examples may also use semiconductor dies comprising MOS transistor structures or vertical transistor structures like, for example, IGBT (Insulated Gate Bipolar Transistor) structures or, in general, transistor structures in which at least one electrical contact pad is arranged on a first main face of the semiconductor die and at least one other electrical contact pad is arranged on a second main face of the semiconductor die, opposite to the first main face.

An efficient power semiconductor module may for example reduce material consumption, ohmic losses, chemical waste, etc. and may thus enable energy and/or resource savings. Improved power semiconductor modules as well as improved methods for fabricating power semiconductor modules, as specified in this description, may thus at least indirectly contribute to green technology solutions, i.e. climate-friendly solutions providing a mitigation of energy and/or resource use.

Figure 1:
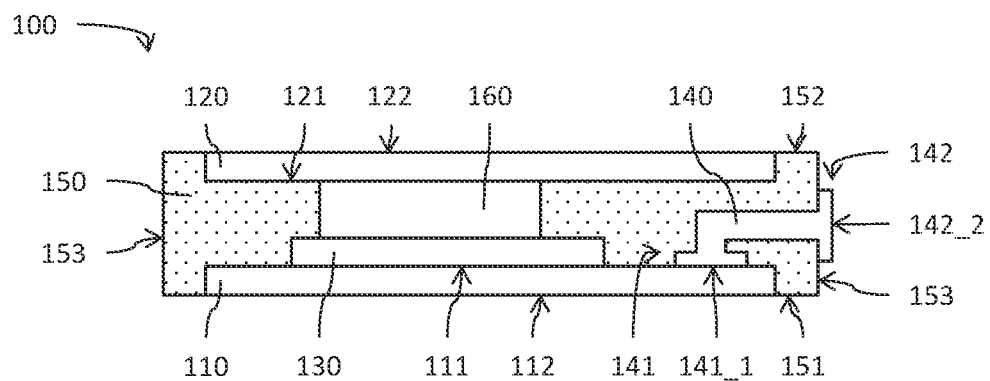
FIG. 1 shows a sectional view of a power semiconductor module comprising at least one tilted rivet.

FIG. 1 shows a power semiconductor module 100 comprising a first substrate 110 and a second substrate 120, at least one power semiconductor die 130, at least one rivet 140 and an encapsulant 150 encapsulating the at least one power semiconductor die 130, the at least one rivet 140 and the first and second substrates 110, 120.

The at least one power semiconductor die 130 is arranged between and thermally coupled to a first side 111 of the first substrate 110 and a first side 121 of the second substrate 120. Furthermore, the at least one power semiconductor die 130 is electrically coupled to the first side 111 of the first substrate 110. The first and second substrates 110, 120 may also comprise respective second sides 112, 122 which are arranged opposite to the respective first sides 111, 121. The second sides 112, 122 of the first and second substrates 110, 120 may be at least partially exposed from the encapsulant 150, in particular from respective opposite first and second sides 151, 152 of the encapsulant.

The at least one rivet 140 comprises a first end 141 and an opposing second end 142, wherein the first end 141 is arranged on and electrically coupled to the first side 111 of the first substrate 110. The second end 142 of the at least one rivet 140 is exposed from the encapsulant 150. For example, the second end 142 may be exposed at a lateral side 153 of the encapsulant, wherein the lateral sides 153 connect the first and second sides 151, 152 of the encapsulant 150. The second end 142 of the at least one rivet 140 is configured to accept a press fit pin such that the at least one power semiconductor die 130 can be electrically contacted from the outside.

The encapsulant 150 is configured to encapsulate the at least one power semiconductor die 130, the at least one rivet 140 and the first and second substrates 110, 120. The encapsulant 150 may in particular be configured to protect the semiconductor die 130 from environmental influences. The encapsulant 150 may for example be a molded body.

The power semiconductor module 100, in particular the power semiconductor die 130, may be configured to operate at high electrical voltage and/or current. For example, the power semiconductor module 100 may be configured to operate with a voltage of 100V or more, or 500V or more, or 1 kV or more, or 10 kV or more. The power semiconductor module 100 may for example comprise a half-bridge circuit, a full-bridge circuit, a converter circuit, an inverter circuit, etc.

The power semiconductor module 100 may be configured for double sided cooling, meaning that heatsinks may be arranged on both the second side 112 of the first substrate 110 and the second side 122 of the second substrate. However, it is also possible that an application board is arranged on at least one of the second sides 112, 122.

The first and second substrates 110, 120 may be substrates of the same type or they may be substrates of different types. The first and/or second substrates 110, 120 may for example be a substrate of the type direct copper bond (DCB), direct aluminum bond (DAB), active metal brazing (AMB), or leadframe. The first and/or second substrate 110, 120 may for example comprise or consist of Al, Cu, or Fe, or an alloy of one or more of these metals. The first sides 111, 121 of the first and second substrates 110, 120 may be structured to comprise conductive tracks and contact pads.

According to an example, the power semiconductor module 100 comprises more than one power semiconductor die 130. The more than one power semiconductor dies 130 may all be of the same type or of different types. The more than one power semiconductor dies 130 may be electrically coupled by the first substrate 110 and/or the second substrate 120. All of the more than one power semiconductor dies 130 may be arranged on the first side 111 of the first substrate, or one or more power semiconductor dies 130 may instead be arranged on the first side 121 of the second substrate 120.

According to an example, the power semiconductor module 100 comprises a thermally and electrically conductive spacer 160 arranged between the power semiconductor die 130 and the second substrate 120. The conductive spacer 160 may be configured to electrically couple a power electrode on the upper face of the power semiconductor die 130 to the second substrate 120. According to an example, the power semiconductor module 100 comprises one or more further conductive spacers configured to electrically couple contact pads on the first sides 111, 121 of the first and second substrates 110, 120 to each other.

The at least one rivet 140 may comprise or consist of any suitable metal or metal alloy, for example Al, Cu, or Fe, or an alloy of one or more of these metals. The at least one rivet 140 may for example be soldered, or sintered, or welded, or glued to the first side 111 of the first substrate 110. In particular, the at least one rivet 140 may be directly coupled to the first side 111 of the first substrate 110, without any intermediate fitting elements.

According to an example, the power semiconductor module 100 comprises a plurality of rivets 140. In particular, some, most, or all of the external contacts of the power semiconductor module 100 may be constituted by rivets 140. In the case of control contacts or sensing contacts (e.g. a gate contact or a temperature sensing contact), a single rivet 140 per external contact may be sufficient. In the case of power contacts (e.g. source, drain, emitter, collector, or phase contacts), several rivets 140 per external contact may be necessary in order to carry the respective electrical currents.

According to an example, the power semiconductor module 100 comprises a plurality of rivets 140, wherein all of the rivets 140 are arranged on the first side 111 of the first substrate 110. According to another example, at least one rivet 140 is arranged on the first side 111 of the first substrate 110 and at least one other rivet 140 is arranged on the first side 121 of the second substrate 120. According to yet another example, all rivets 140 are arranged on the first side 121 of the second substrate 120.

As shown in FIG. 1, the rivet 140 may be tilted such that a first end face 141_1 at the first end 141 of the rivet 140 faces the first substrate 110, in particular the first side 111 of the first substrate 110. A second end face 142_2 at the second end 142 of the rivet 140 may be arranged at an angle with respect to the first end face 141_1. The angle between the end faces 141_1, 142_2 may for example be in the range of 45° to 135°, in particular about 90°. The first end face 141_1 may essentially be arranged parallel to the first side 111 of the first substrate 110. The second end face 142_2 may essentially be arranged parallel to the respective lateral side 153 of the encapsulant 150. The second end face 142_2 may essentially be arranged perpendicular to the first side 111 of the first substrate 110.

In the example shown in FIG. 1, the second end 142 of the rivet 140 juts out of the encapsulant 150. However, it is also possible that the rivet 140 does not jut out of the encapsulant 150, such that the second end face 142_2 is essentially coplanar with the lateral side 153.

The encapsulant 150 may for example comprise or consist of an epoxy. According to an example, the encapsulant may further comprise filler particles configured to reduce the thermal resistance of the encapsulant 150. The encapsulant 150 may e.g. be fabricated by injection molding, compression molding, or transfer molding. According to another example, the encapsulant 150 comprises or consists of a laminate.

Figure 2A:
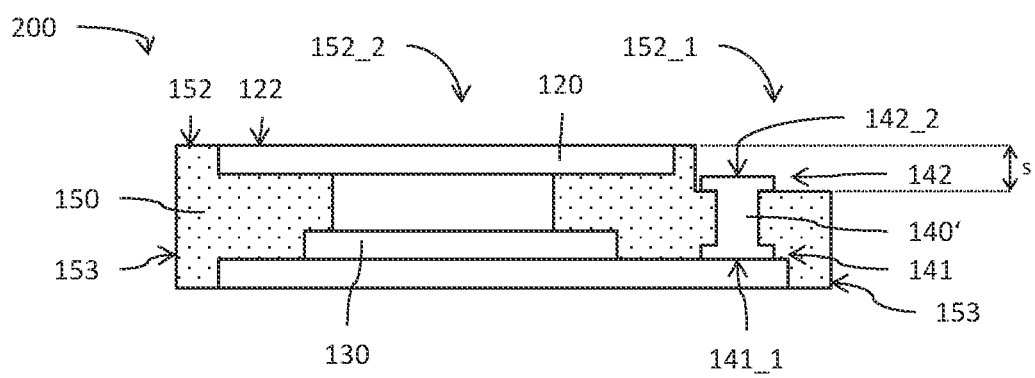
FIGS. 2A and 2B each show a sectional view of a further power semiconductor module comprising an essentially straight rivet.

FIG. 2A shows a further power semiconductor module 200 which may be similar or identical to the power semiconductor module 100, except for the differences described in the following.

In the power semiconductor module 200, the at least one rivet 140' is not tilted but essentially straight. In other words, the first and second end faces 141_1, 142_2 of the at least one rivet 140' may essentially be arranged parallel to each other.

Furthermore, the second end 142 (and the second end face 142_2) may be exposed from the encapsulant 150 at the second side 152 of the encapsulant 150. The exposed second end 142 of the at least one rivet 140' may be spaced sufficiently apart from the exposed second side 122 of the second substrate 120, such that no short occurs during operation of the power semiconductor module 200.

According to an example, the second side 152 of the encapsulant 150 comprises a recessed part 152_1 and the second end 142 of the at least one rivet 140 is exposed from the encapsulant 150 at the recessed part 152_1. The second side 152 also comprises a non-recessed part 152_2, wherein the second substrate 120 is exposed from the encapsulant 150 at the non-recessed part 152_2. The second side 152 of the encapsulant 150 may for example comprise a step s between the recessed part 152_1 and the non-recessed part 152_2 of 50 μm or more, or 100 μm or more, or 300 μm or more, or 500 μm or more, or 1 mm or more, or 3 mm or more.

According to another example, the power semiconductor module 200 does not comprise a recessed part and instead the at least one rivet 140' is essentially exposed from the encapsulant in a plane comprising the second substrate 120 (in particular, the second side 122 of the second substrate 120).

According to an example, the recessed part 152_1 is fabricated by using a molding tool which comprises a corresponding recess. According to another example, the recessed part 152_1 is formed by removing material from the encapsulant, e.g. using a suitable cutting process or grinding process.

According to an example, the power semiconductor module 200 comprises a plurality of rivets 140', wherein all of the rivets 140' are arranged within the same recessed part 152_1. According to another example, the power semiconductor module 200 comprises more than one recessed part 152_1 at the second side 152 of the encapsulant 150, wherein some or all of rivets 140' are arranged within different ones of the recessed parts 152_1. The more than one recessed parts 152_1 may e.g. be arranged adjacent to different lateral sides 153 of the encapsulant 150, e.g. adjacent to opposite lateral sides 153.

Figure 2B:
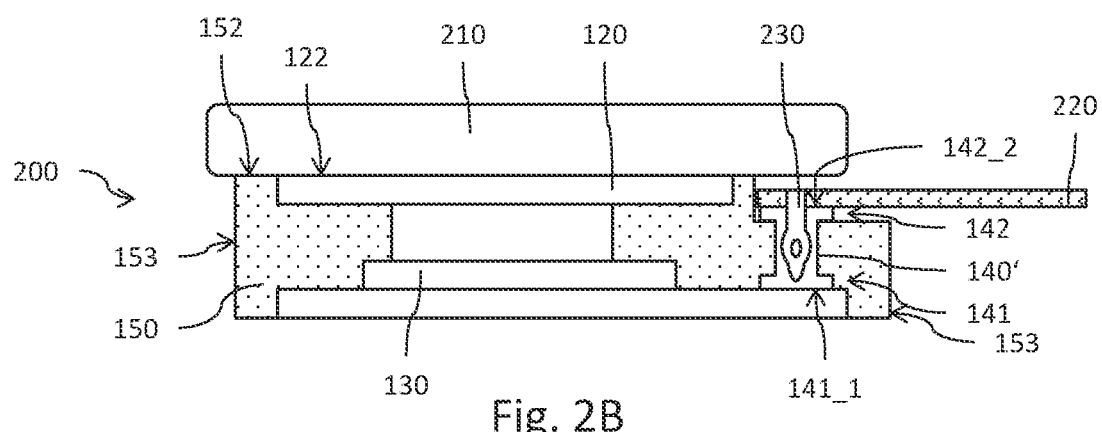

FIG. 2B shows a heatsink 210 and an application board 220 arranged on the second side 152 of the encapsulation 150. The application board 220 is electrically coupled to the power semiconductor module 200 by at least one press fit pin 230 forming a press fit connection with the at least one rivet 140'. The application board 220 may for example be configured to drive the power semiconductor die 130.

Due to the step s between the recessed part 152_1 and the non-recessed part 152_2, the heatsink may extend over the recessed part 152_1 of the second side 150 of the encapsulant without colliding with the application board 220. However, it is also possible that a heatsink is used which does not extend over the recessed part 152_1.

The at least one press fit pin 230 may for example be coupled to the application board 220 with a solder joint and/or with a press fit connection. Electrically coupling the power semiconductor module 200 to the application board 220 may comprise pressing the press fit pin 230 into the rivet 140. It may in particular not be necessary to fabricate any solder joints between the power semiconductor module 200 and the application board 220.

FIGS. 3A to 3D show different examples of a power semiconductor module 300 which may be similar or identical to the power semiconductor module 100 or 200, except that at least one press fit pin 310 instead of a rivet 140 is used to provide an external contact of the power semiconductor module 300.

The at least one press fit pin 310 may be arranged on and electrically coupled to the first side 111 or 121 of the first substrate 110 or the second substrate 120, as described with respect to the at least one rivet 140.

Figure 3A:
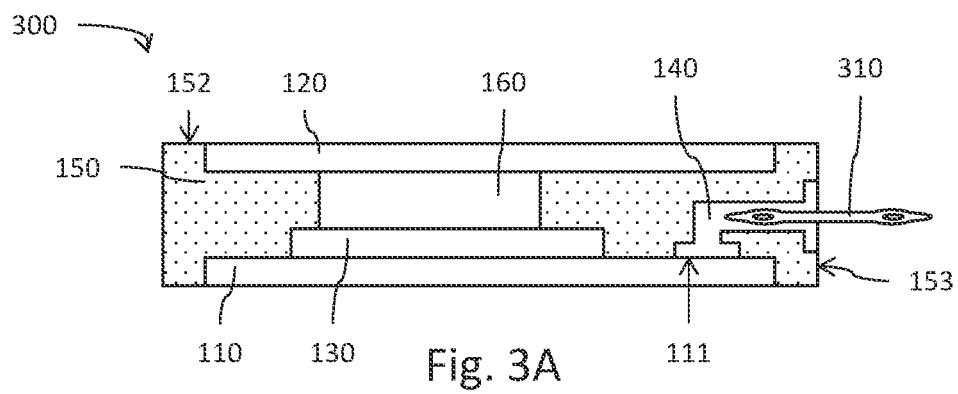
FIGS. 3A to 3D show sectional views of further power semiconductor modules comprising at least one press fit pin.

FIG. 3A shows an example of the power semiconductor module 300, wherein a tilted rivet 140 is used to couple the press fit pin 310 to the first side 111 of the first substrate 110. The at least one press fit pin 310 is exposed from the encapsulant 150 at a lateral side 153.

Coupling the power semiconductor module 300 to an application board may comprise arranging the application board at the lateral side 153 with the at least one press fit pin 310 and pressing the press fit pin 310 into a rivet or a through hole of the application board. It is in particular not necessary to solder the power semiconductor module 300 to the application board. The press fit pin 310 may be pressed into the rivet 140 of the power semiconductor module 300 before it is pressed into a rivet or through hole of the application board.

Figure 3B:
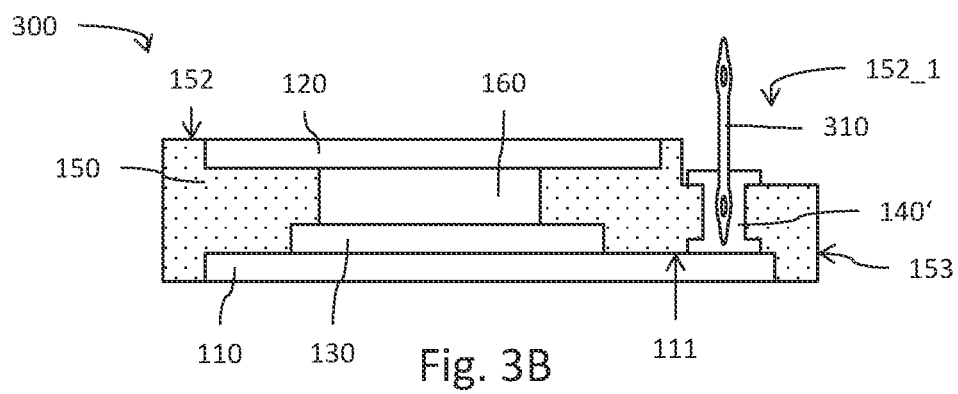

FIG. 3B shows another example of the power semiconductor module 300, wherein a straight rivet 140' is used to couple the press fit pin 310 to the first side 111 of the first substrate 110. The at least one press fit pin 310 is therefore exposed from the encapsulant 150 at the second side 152. The at least one press fit pin 310 may be arranged within a recessed part 152_1 of the second side 152. According to another example, the second side 152 does not comprise a recessed part 152_1.

Figure 3C:
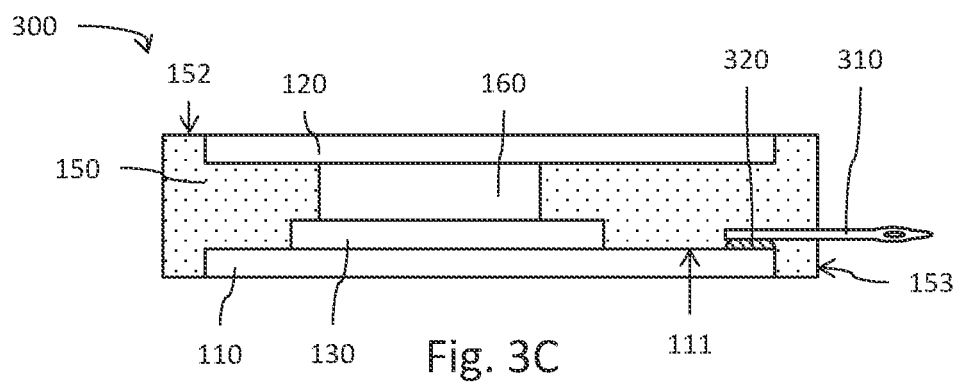

In the example shown in FIG. 3C, the press fit pin 310 is coupled directly to the first side 111 of the first substrate 110 with a joint 320. In particular, no intermediate fitting element like the rivet 140 is used to couple the press fit pin 310 to the first substrate 110. The joint 320 may for example be a solder joint, a sintered joint, a glued joint, or a welded joint.

The press fit pin 310 is arranged on the first side 111 of the first substrate 110 such that a longitudinal axis of the press fit pin 310 is essentially parallel to the first side 111.

According to an example, the press fit pin 310 comprises a dedicated coupling area which is coupled to the joint 320. The coupling area may for example comprise a flattened part and/or a through hole in order to improve the coupling strength of the joint 320.

Figure 3D:
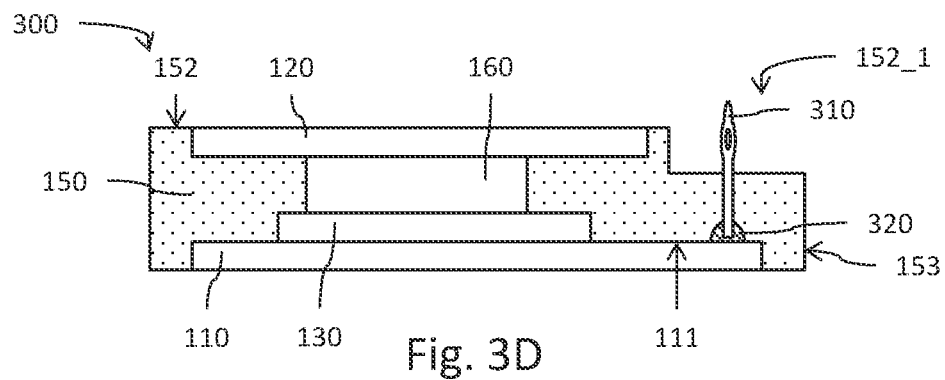

In the example shown in FIG. 3D, the at least one press fit pin 310 is also coupled directly to the first side 111 of the first substrate 110, as described with respect to FIG. 3C. However, in the example of FIG. 3D, the longitudinal axis of the press fit pin 310 is arranged essentially perpendicular to the first side 111.

According to an example, the press fit pin 310 comprises a flattened end face facing the first side 111 of the first substrate 110 in order to improve the coupling strength of the joint 320.

Figure 4A:
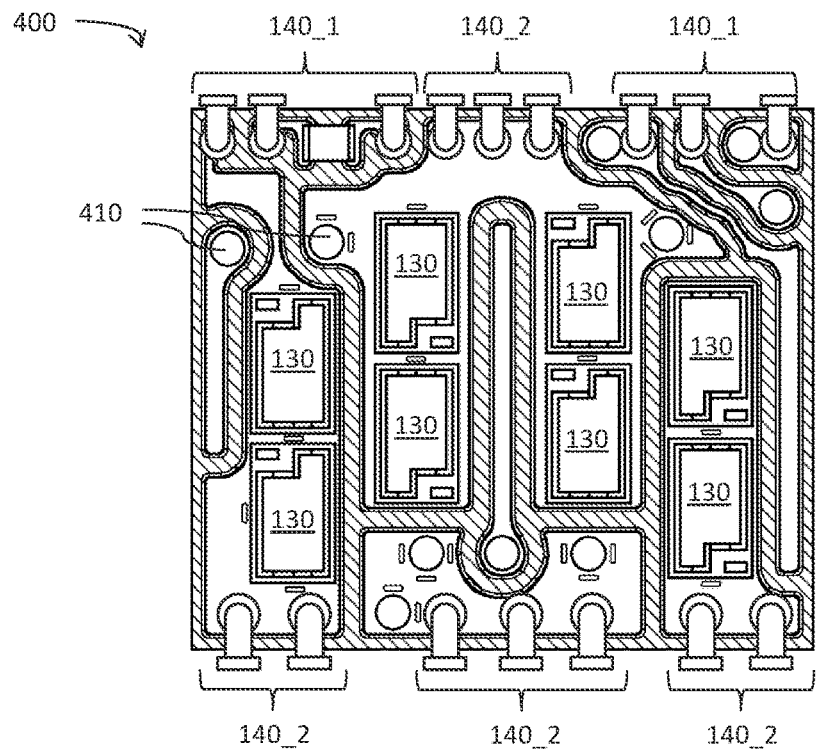
FIGS. 4A and 4B show top views of further power semiconductor modules comprising a plurality of rivets (FIG. 4A) and a plurality of press fit pins (FIG. 4B), respectively.
Figure 4B:
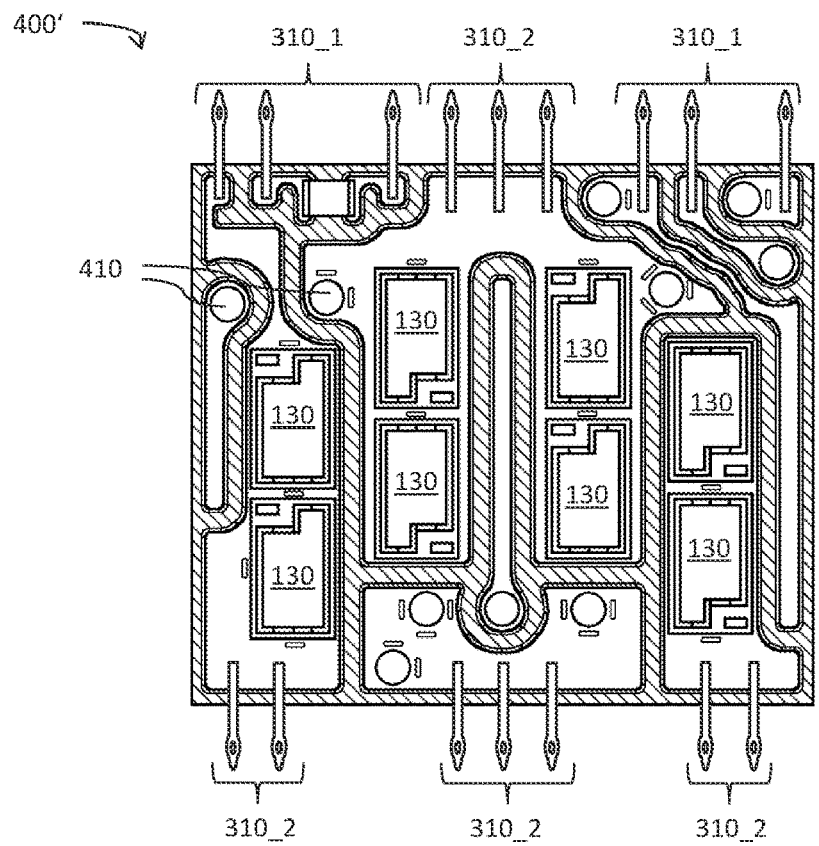

FIGS. 4A and 4B show top views of further power semiconductor modules 400 and 400' which may be similar or identical to anyone of the power semiconductor modules 100 to 300. The second substrate 120, as well as the encapsulant 150, are omitted in FIGS. 4A and 4B in order to show the interior of the power semiconductor modules 400 and 400'.

The power semiconductor module 400 shown in FIG. 4A comprises a plurality of rivets 140 configured to act as external contacts of the power semiconductor module 400. The power semiconductor module 400 may comprise a plurality of power semiconductor dies 130. Conductive spacers 160 may be arranged on top of the power semiconductor dies 130. Furthermore, the power semiconductor module 400 may comprise one or more further spacers 410 to electrically couple conductive tracks on the first substrate 110 to conductive tracks on the second substrate 120.

The semiconductor module 400 may comprise rivets 140 arranged at more than one of its lateral sides, e.g. at opposite lateral sides as shown in the example of FIG. 4A. However, it is also possible that the power semiconductor module 400 only comprises rivets 140 arranged at a single lateral side.

According to an example, the power semiconductor module 400 comprises rivets 140 of a first group of rivets 140_1 and rivets 140 of a second group of rivets 140_2. The rivets 140 of the first group of rivets 140_1 may for example be control contacts and/or sensing contacts of the power semiconductor module 400. The rivets 140 of the second group of rivets 140_2 may for example be power contacts of the power semiconductor module 400.

According to an example, each rivet 140 of the first group of rivets 140_1 is electrically coupled to a different part of the power semiconductor module 400 and therefore provides a different type of external control contact or external sensing contact. According to an example, several of the rivets 140 (e.g. two rivets 140, three rivets 140, . . . ) of the second group of rivets 140_2 are electrically coupled to the same part of the power semiconductor module 400 and therefore form a common external power contact.

According to an example, some of the external contacts of the power semiconductor module 400 are provided by rivets 140 and other external contacts are provided by leadframe parts. For example, control contacts and/or sensing contacts may be provided by rivets and power contacts are provided by leadframe parts, or vice versa. According to an example, the rivets 140 on the one hand and the leadframe parts on the other hand point in perpendicular directions, e.g. such that the leadframe parts can be contacted from above the second side 152 or below the first side 151 of the encapsulant and the rivets 140 can be contacted from the lateral sides 153.

The power semiconductor module 400' shown in FIG. 4B may be identical to the power semiconductor module 400, except that the power semiconductor module 400' comprises press fit pins 310 configured to act as external contacts. In particular, a first group of press fit pins 310_1 may correspond to the first group of rivets 140_1 and a second group of press fit pins 310_2 may correspond to the second group of rivets 140_2.

Figure 5:
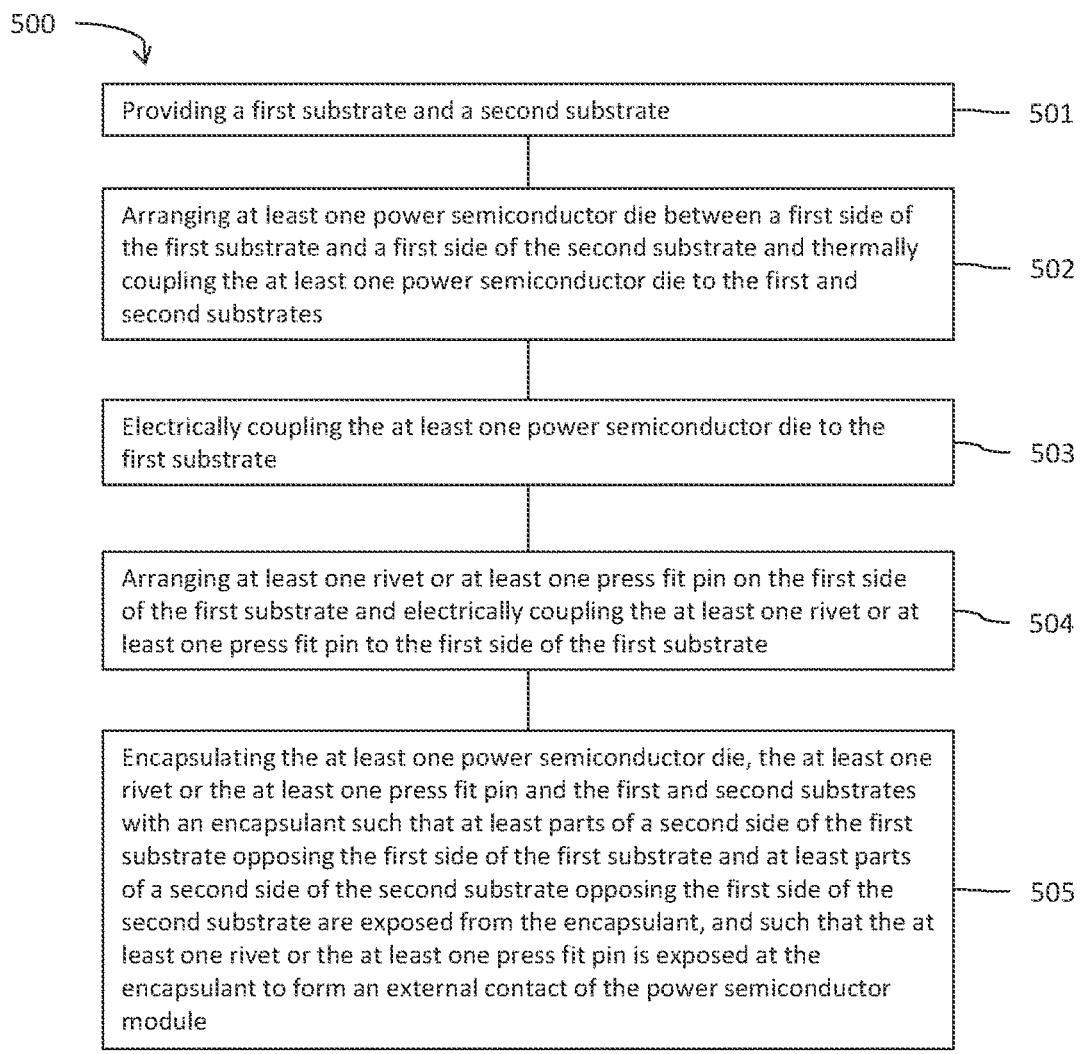
FIG. 5 is a flow chart of an exemplary method for fabricating power semiconductor modules.

FIG. 5 is a flow chart of a method 500 method for fabricating power semiconductor modules. The method 500 may for example be used to fabricate the power semiconductor modules 100 to 400'.

The method 500 comprises at 501 an act of providing a first substrate and a second substrate, at 502 an act of arranging at least one power semiconductor die between a first side of the first substrate and a first side of the second substrate and thermally coupling the at least one power semiconductor die to the first and second substrates, at 503 an act of electrically coupling the at least one power semiconductor die to the first substrate, at 504 an act of arranging at least one rivet or at least one press fit pin on the first side of the first substrate and electrically coupling the at least one rivet or at least one press fit pin to the first side of the first substrate, and at 505 an act of encapsulating the at least one power semiconductor die, the at least one rivet or the at least one press fit pin and the first and second substrates with an encapsulant such that at least parts of a second side of the first substrate opposing the first side of the first substrate and at least parts of a second side of the second substrate opposing the first side of the second substrate are exposed from the encapsulant, and such that the at least one rivet or the at least one press fit pin is exposed at the encapsulant to form an external contact of the power semiconductor module.

Figure 6:
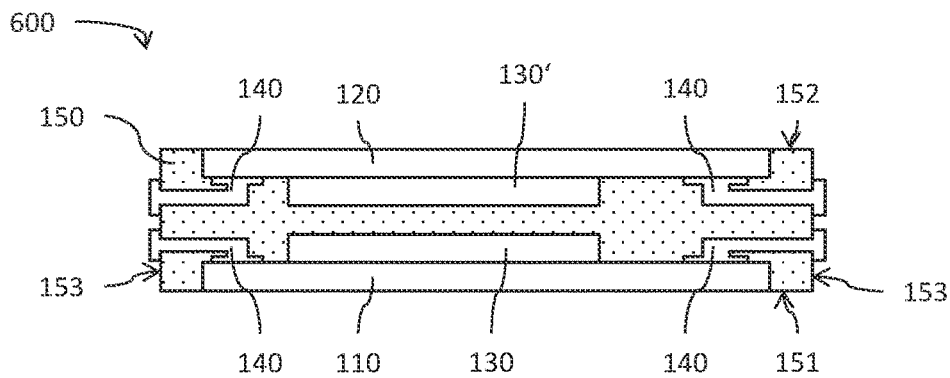
FIG. 6 shows a power semiconductor module comprising opposing substrates, wherein rivets are coupled to both of the substrates.

FIG. 6 shows a further power semiconductor module 600 which may be similar or identical to anyone of the power semiconductor modules 100 to 400'. The power semiconductor module 600 comprises at least one power semiconductor die 130 arranged on the first substrate 110 and at least one further power semiconductor die 130' arranged on the second substrate 120. According to an example, the power semiconductor module 600 does not comprise the spacers 160 (compare FIG. 1).

The power semiconductor module 600 may further comprise a plurality of rivets 140. According to an example, one or more of the rivets 140 are coupled to the first substrate 110 and one or more further rivets 140 are coupled to the second substrate 120. The rivets may for example be exposed from the encapsulant 150 at one or more lateral sides 153.

According to another example, the power semiconductor module 600 comprises the press fit pins 310 instead of the rivets 140, as e.g. described with respect to FIG. 3C.

In the following, the power semiconductor module as well as the method for fabricating power semiconductor modules are further explained using specific examples.

Example 1 is a power semiconductor module, comprising: a first substrate and a second substrate, at least one power semiconductor die arranged between a first side of the first substrate and a first side of the second substrate, the at least one power semiconductor die being electrically and thermally coupled to at least the first side of the first substrate, at least one rivet, wherein a first end of the rivet is arranged on and electrically coupled to the first side of the first substrate, and an encapsulant encapsulating the at least one power semiconductor die, the at least one rivet and the first and second substrates, wherein at least parts of a second side of the first substrate opposing the first side of the first substrate and at least parts of a second side of the second substrate opposing the first side of the second substrate are exposed from the encapsulant, and wherein a second end of the at least one rivet is exposed at the encapsulant and configured to accept a press fit pin such that the at least one power semiconductor die can be electrically contacted from the outside.

Example 2 is the power semiconductor module of example 1, wherein the encapsulant comprises a first side and an opposing second side, wherein the first substrate is arranged at the first side of the encapsulant and the second substrate is arranged at the second side of the encapsulant, and wherein the second end of the at least one rivet is exposed at the second side of the encapsulant.

Example 3 is the power semiconductor module of example 2, wherein the second side of the encapsulant comprises a recessed part, and wherein the second end of the at least one rivet is exposed from the encapsulant at the recessed part.

Example 4 is the power semiconductor module of example 1, wherein the encapsulant comprises a first side and an opposing second side, wherein the first substrate is arranged at the first side of the encapsulant and the second substrate is arranged at the second side of the encapsulant, and wherein the second end of the at least one rivet is exposed from the encapsulant at a lateral side of the encapsulant connecting the first and second sides of the encapsulant.

Example 5 is the power semiconductor module of example 4, wherein the at least one rivet is tilted such that a first end face at the first end of the rivet faces the first substrate.

Example 6 is the power semiconductor module of one of the preceding examples, wherein the at least one rivet is configured to provide a control contact or a sensing contact of the power semiconductor module, or wherein the at least one rivet is configured to provide a power contact of the power semiconductor module.

Example 7 is a power semiconductor module, comprising: a first substrate and a second substrate, at least one power semiconductor die arranged between and thermally coupled to a first side of the first substrate and a first side of the second substrate, the at least one power semiconductor die being electrically coupled to the first side of the first substrate, at least one press fit pin arranged on and electrically coupled to the first side of the first substrate, and an encapsulant encapsulating the at least one power semiconductor die, the at least one press fit pin and the first and second substrates, wherein at least parts of a second side of the first substrate opposing the first side of the first substrate and at least parts of a second side of the second substrate opposing the first side of the second substrate are exposed from the encapsulant, and wherein an external part of the at least one press fit pin is exposed from the encapsulant to form an external contact of the power semiconductor module.

Example 8 is the power semiconductor module of example 7, wherein the encapsulant comprises a first side and an opposing second side, wherein the first substrate is arranged at the first side of the encapsulant and the second substrate is arranged at the second side of the encapsulant, and wherein the external part of the at least one press fit pin is exposed at a lateral side of the encapsulant connecting the first and second sides of the encapsulant.

Example 9 is the power semiconductor module of example 8, wherein the power semiconductor module is configured to be coupled to a printed circuit board such that a lateral side from which the at least one press fit pin extends faces the printed circuit board.

Example 10 is the power semiconductor module of one of examples 7 to 9, wherein the at least one press fit pin is soldered, or sintered, or welded, or glued directly to the first side of the first substrate, without any intermediate fitting elements.

Example 11 is a method for fabricating a power semiconductor module, the method comprising: providing a first substrate and a second substrate, arranging at least one power semiconductor die between a first side of the first substrate and a first side of the second substrate and thermally coupling the at least one power semiconductor die to the first and second substrates, electrically coupling the at least one power semiconductor die to the first substrate, arranging at least one rivet or at least one press fit pin on the first side of the first substrate and electrically coupling the at least one rivet or at least one press fit pin to the first side of the first substrate, and encapsulating the at least one power semiconductor die, the at least one rivet or the at least one press fit pin and the first and second substrates with an encapsulant such that at least parts of a second side of the first substrate opposing the first side of the first substrate and at least parts of a second side of the second substrate opposing the first side of the second substrate are exposed from the encapsulant, and such that the at least one rivet or the at least one press fit pin is exposed at the encapsulant to form an external contact of the power semiconductor module.

Example 12 is the method of example 13, wherein the encapsulant comprises a first side and an opposing second side, wherein the first substrate is arranged at the first side of the encapsulant and the second substrate is arranged at the second side of the encapsulant, and wherein the at least one rivet or the at least one press fit pin is exposed from the encapsulant at a lateral side of the encapsulant connecting the first and second sides of the encapsulant.

Example 13 is an apparatus comprising means for performing the method according to example 11 or 12.

While the disclosure has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the disclosure.

The invention claimed is:

1. A power semiconductor module, comprising:
a first substrate and a second substrate;
at least one power semiconductor die arranged between a first side of the first substrate and a first side of the second substrate, the at least one power semiconductor die being electrically and thermally coupled to at least the first side of the first substrate;
at least one rivet having a first end arranged on and electrically coupled to the first side of the first substrate; and
an encapsulant encapsulating the at least one power semiconductor die and at least partially encapsulating the at least one rivet and the first and second substrates,
wherein the encapsulant comprises a first side and an opposing second side,
wherein the first substrate is arranged at the first side of the encapsulant and the second substrate is arranged at the second side of the encapsulant,
wherein at least parts of a second side of the first substrate opposing the first side of the first substrate and at least parts of a second side of the second substrate opposing the first side of the second substrate are exposed from the encapsulant,
wherein a second end of the at least one rivet is exposed at the second side of the encapsulant and configured to accept a press fit pin such that the at least one power semiconductor die can be electrically contacted from the outside.

2. The power semiconductor module of claim 1, wherein the second side of the encapsulant comprises a recessed part, and wherein the second end of the at least one rivet is exposed from the encapsulant at the recessed part.

3. The power semiconductor module of claim 1, wherein the at least one rivet is configured to provide a control contact or a sensing contact of the power semiconductor module, or wherein the at least one rivet is configured to provide a power contact of the power semiconductor module.

4. The power semiconductor module of claim 1,
wherein the encapsulant further comprises:
a lateral side connecting the first side and the second side; and
a recessed part formed along an intersection of the second side and the lateral side, and
wherein the second end of the at least one rivet is exposed from the encapsulant at the recessed part.

5. The power semiconductor module of claim 4, further comprising:
a heatsink arranged on the second side of the encapsulant, wherein the heatsink extends over the recessed part of the encapsulant and the second end of the at least one rivet that is exposed from the encapsulant at the recessed part.

6. The power semiconductor module of claim 1, wherein the second end of the at least one rivet is completely exposed and has not yet received the press fit pin.

7. A power semiconductor module, comprising:
a first substrate and a second substrate;
at least one power semiconductor die arranged between and thermally coupled to a first side of the first substrate and a first side of the second substrate, the at least one power semiconductor die being electrically coupled to the first side of the first substrate;
at least one electrically conductive pin arranged on and electrically coupled to the first side of the first substrate; and
an encapsulant encapsulating the at least one power semiconductor die and at least partially encapsulating the at least one electrically conductive pin and the first and second substrates,
wherein the encapsulant comprises:
a first side;
a second side opposing the first side;
a lateral side connecting the first side and the second side; and
a recessed part formed along an intersection of the second side and the lateral side,
wherein the first substrate is arranged at the first side of the encapsulant and the second substrate is arranged at the second side of the encapsulant,
wherein at least parts of a second side of the first substrate opposing the first side of the first substrate and at least parts of a second side of the second substrate opposing the first side of the second substrate are exposed from the encapsulant, and
wherein an external part of the at least one electrically conductive pin is exposed from the encapsulant at the recessed part to form an external contact of the power semiconductor module.

8. The power semiconductor module of claim 7, wherein the at least one electrically conductive pin is soldered, or sintered, or welded, or glued directly to the first side of the first substrate, without any intermediate fitting elements.

9. A power semiconductor module, comprising:
a first substrate and a second substrate;
at least one power semiconductor die arranged between a first side of the first substrate and a first side of the second substrate, the at least one power semiconductor die being electrically and thermally coupled to at least the first side of the first substrate;
at least one rivet having a first end arranged on and electrically coupled to the first side of the first substrate; and
an encapsulant encapsulating the at least one power semiconductor die and at least partially encapsulating the at least one rivet and the first and second substrates,
wherein at least parts of a second side of the first substrate opposing the first side of the first substrate and at least parts of a second side of the second substrate opposing the first side of the second substrate are exposed from the encapsulant,
wherein a second end of the at least one rivet is exposed at the encapsulant and configured to accept a press fit pin such that the at least one power semiconductor die can be electrically contacted from the outside,
wherein the encapsulant comprises a first side and an opposing second side,
wherein the first substrate is arranged at the first side of the encapsulant and the second substrate is arranged at the second side of the encapsulant, and
wherein the at least one rivet is tilted such that a first end face at the first end of the rivet faces the first substrate and the second end of the at least one rivet is exposed from the encapsulant at a lateral side of the encapsulant connecting the first and second sides of the encapsulant.

* * * * *